US009622379B1

(12) United States Patent
Campbell et al.

(10) Patent No.: US 9,622,379 B1
(45) Date of Patent: Apr. 11, 2017

(54) DRAWER-LEVEL IMMERSION-COOLING WITH HINGED, LIQUID-COOLED HEAT SINK

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/926,035

(22) Filed: Oct. 29, 2015

(51) Int. Cl.
*H05K 7/20* (2006.01)
*H01L 23/473* (2006.01)

(52) U.S. Cl.
CPC ..... *H05K 7/20318* (2013.01); *H05K 7/20127* (2013.01)

(58) Field of Classification Search
CPC . G06F 1/181–1/182; H05K 7/20218–7/20381;
(Continued)

(56) References Cited

U.S. PATENT DOCUMENTS 8,654,529 B2   2/2014 Attlesey
2003/0147214 A1* 8/2003 Patel ................. G06F 1/20
                                                 361/699
(Continued)

FOREIGN PATENT DOCUMENTS

EP        2506697 A2    2/2012
WO   WO2010/019517 A1   2/2010
(Continued)

OTHER PUBLICATIONS

Nelson, Graham, "Development of an Experimentally-Validated Compact Model of a Server Rack", Master of Science Thesis, Georgia Institute of Technology (Dec. 2007) (167 pages).
(Continued)

*Primary Examiner* — Anthony Haughton
*Assistant Examiner* — Razmeen Gafur
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses and methods of fabrication are provided which facilitate immersion-cooling of an electronic component(s). The cooling apparatus includes a drawer-level enclosure sized to reside within an electronics rack. The drawer-level enclosure includes a compartment which accommodates one or more electronic components to be cooled. A dielectric fluid is disposed within the compartment. The dielectric fluid includes a liquid dielectric which at least partially immerses the electronic component(s) within the compartment(s). A hinged, liquid-cooled heat sink is also disposed within the compartment of the enclosure. The heat sink operatively facilitates cooling the one or more electronic components via the dielectric fluid within the compartment, and is rotatable between an operational posi-
(Continued)

tion overlying the electronic component(s), and a service position which allows access to the electronic component(s).

18 Claims, 8 Drawing Sheets

(58) Field of Classification Search
CPC .............. H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 2004/0100770 A1* | 5/2004 | Chu | H05K 7/20754 361/698 |
| 2005/0243517 A1* | 11/2005 | Malone | G06F 1/20 361/699 |
| 2006/0139877 A1* | 6/2006 | Germagian | H05K 7/20745 361/695 |
| 2007/0146994 A1* | 6/2007 | Germagian | H05K 7/20745 361/695 |
| 2008/0253085 A1 | 10/2008 | Soffer | |
| 2008/0266798 A1* | 10/2008 | Eckberg | H05K 7/20272 361/699 |
| 2009/0262501 A1* | 10/2009 | Claassen | G06F 1/20 361/701 |
| 2010/0328889 A1 | 12/2010 | Campbell et al. | |
| 2011/0063792 A1* | 3/2011 | Schmidt | G06F 1/20 361/679.46 |
| 2011/0134604 A1* | 6/2011 | Attlesey | G06F 1/20 361/679.47 |
| 2011/0286175 A1* | 11/2011 | Iyengar | G06F 1/20 361/679.47 |
| 2011/0317367 A1 | 12/2011 | Campbell et al. | |
| 2012/0201005 A1* | 8/2012 | Barringer | H05K 7/20736 361/701 |
| 2012/0281359 A1* | 11/2012 | Arney | H05K 7/20645 361/701 |
| 2012/0300398 A1* | 11/2012 | Eckberg | H05K 7/2079 361/692 |
| 2013/0265725 A1* | 10/2013 | Harvilchuck | G06F 1/181 361/720 |
| 2013/0308266 A1* | 11/2013 | Sullivan | G06F 1/20 361/679.46 |
| 2015/0109729 A1 | 4/2015 | Campbell et al. | |

FOREIGN PATENT DOCUMENTS

| | | |
|---|---|---|
| WO | WO2014/116370 A1 | 7/2014 |
| WO | WO2014120276 A1 | 8/2014 |

OTHER PUBLICATIONS

Sridhar, Aravind, "Experimental Evaluation of Immersion-Cooled Strategies for High-Powered Server Modules", Master of Science Thesis, Auburn University (Aug. 4, 2012) (129 pages).

Campbell et al., "Drawer-Level Immersion-Cooling with Hinged, Liquid-Cooled Heat Sink", U.S. Appl. No. 15/175,331, filed Jun. 7, 2016 (31 page).

Campbell et al., List of IBM Patents and Patent Applications Treated as Related, U.S Appl. No. 14/926,035, filed Oct. 29, 2015, dated Jun. 8, 2016 (2 pages).

Campbell et al., Examination Report for GB Application No. GB1614688.8, dated Feb. 8, 2017, (8 Pages).

\* cited by examiner

DRAWER-LEVEL IMMERSION-COOLING WITH HINGED, LIQUID-COOLED HEAT SINK

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques, using, for instance, liquid cooling.

SUMMARY

The shortcomings of the prior art are overcome and additional advantages are provided through the provision, in one aspect, of a cooling apparatus which includes an enclosure, a dielectric fluid, and a hinged, liquid-cooled heat sink. The enclosure is sized to reside within an electronics rack, and includes a compartment accommodating one or more electronic components to be cooled. The dielectric fluid resides within the compartment, and includes a liquid dielectric that at least partially immerses the one or more electronic components to be cooled. The hinged, liquid-cooled heat sink is disposed within the compartment of the enclosure, and operatively facilitates cooling the one or more electronic components via the dielectric fluid within the compartment. The hinged, liquid-cooled heat sink is rotatable between an operational position overlying the one or more electronic components within the compartment, and a service position which allows access to the one or more electronic components within the compartment.

In another aspect, a cooled electronics rack is provided which includes an electronics rack comprising a plurality of electronic systems to be cooled, and a cooling apparatus. The cooling apparatus includes: a plurality of drawer-level enclosures sized to reside within the electronics rack, each drawer-level enclosure comprising a compartment accommodating a respective electronic system of the plurality of electronic systems; a dielectric fluid within each compartment, the dielectric fluid comprising a liquid dielectric at least partially immersing the respective electronic system within the compartment; and at least one hinged, liquid-cooled heat sink associated with at least one drawer-level enclosure of the plurality of drawer-level enclosures, each hinged, liquid-cooled heat sink being disposed within the compartment of a respective drawer-level enclosure of the at least one drawer-level enclosure, and operatively facilitating cooling of the respective electronic system via the dielectric fluid within the compartment, each hinged, liquid-cooled heat sink being rotatable between an operational position overlying the respective electronic system within the compartment, and a service position which allows access to the electronic system within the compartment.

In a further aspect, a method of fabricating a cooling apparatus is provided to facilitate cooling one or more electronic components. The method includes: providing an enclosure sized to reside within an electronics rack, the enclosure comprising a compartment accommodating the one or more electronic components; providing a dielectric fluid within the compartment, the dielectric fluid comprising a liquid dielectric at least partially immersing the one or more electronic components; and hingedly mounting a liquid-cooled heat sink within the compartment of the enclosure, the hinged, liquid-cooled heat sink operatively facilitating cooling of the one or more electronic components via the dielectric fluid within the compartment, and the hinged, liquid-cooled heat sink being rotatable between an operational position overlying the one or more electronic components within the compartment, and a service position which allows access to the one or more electronic components within the compartment.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
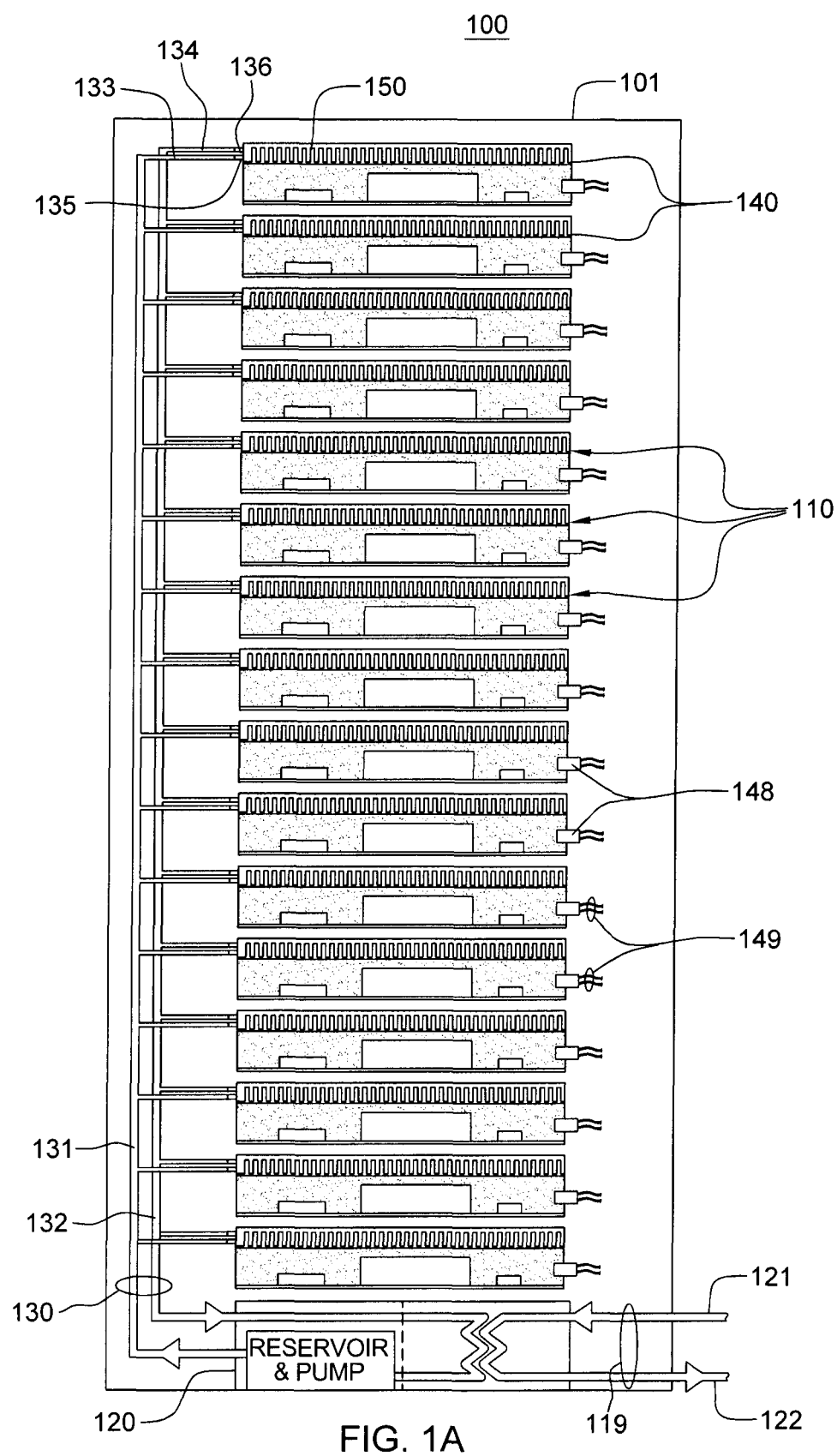
FIG. 1A is an elevational view of one embodiment of a liquid-cooled electronics rack with drawer-level immersion-cooling of electronic components and/or systems, in accordance with one or more aspects of the present invention.

Aspects of the present invention and certain features, advantages, and details thereof, are explained more fully below with reference to the non-limiting embodiments illustrated in the accompanying drawings. It should be understood that the detailed description and examples provided, while indicating embodiments of the invention, are given by way of illustration only, and not by way of limitation. Various substitutions, modifications, additions, and/or arrangements within the spirit and/or scope of the underlying inventive concepts will be apparent to those skilled in the art from this disclosure.

In a conventional raised-floor layout of an air-cooled data center, multiple electronics racks may be disposed in one or more rows. As understood in the art, "electronics rack", "rack", "information technology (IT) rack", etc., may be used interchangeably, and unless otherwise specified, include any housing, frame, support, structure, compartment, etc., having heat-generating components of a computer system, electronics system, IT system, etc. A computer installation may house several hundred or even several thousand microprocessors. For instance, in one or more implementations, a computer system may include multiple rack-mounted servers, with the rack being enclosed in a cabinet containing multiple mounting slots called bays, each designed to hold a drawer in which is packaged the electronics hardware comprising, for instance, a respective server node. One typical rack configuration utilizes multiple drawers stacked one above the other horizontally.

In one implementation, an electronics rack may be totally air-cooled. In such a case, one or more air-moving devices may be provided to facilitate airflow through the electronics rack to cool the heat-dissipating electronic components or modules within the rack. While traditionally, air-cooled electronics racks have been commonly used, they are limited in the amount of heat dissipation that can be accomplished. This constraint poses a limit on the amount of computing performance that can be achieved in an electronics rack using air-cooling only.

To overcome this limitation, certain high-performance computer systems now utilize a combination of air-cooling and water-cooling. For instance, air-moving devices may still provide air-cooling to lower-power components, but water may be supplied to cold plates mounted to respective high-heat dissipating components, such as processor modules, to accommodate their higher-heat dissipation. Water may be supplied to and returned from each server node in parallel by supply and return manifolds at one side of the electronics rack. Although air-cooled and air- and water-cooled electronics racks are performing their functions at present power levels, continuing increases in power consumption to provide increased functional computing performance requires ever-more effective cooling needs. In addition, the introduction of 3-D chip packaging technology further exacerbates the cooling challenge.

Immersion-cooling is one possible solution to these issues. In immersion-cooling, the components to be cooled are immersed in a dielectric fluid that dissipates heat, for instance, through boiling. The vapor is then condensed by a secondary liquid, using, for instance, finned condensers. Alternatively, single-phase natural convection immersion-cooling can be employed in combination with a liquid-cooled heat sink immersed within the dielectric fluid, as explained further below. Direct immersion-cooling of one or more electronic components of an electronic system, such as a drawer-level electronic system of an electronics rack, using dielectric fluid (e.g., a liquid dielectric coolant) advantageously avoids the need for any forced air-cooling and enables total liquid-cooling of an electronics node, and thus, the electronics rack within the data center. The use of dielectric fluid immersion-cooling may offer several unique benefits over other cooling approaches.

For example, the use of a dielectric fluid that condenses at a temperature above typical outdoor ambient air temperature would enable data center cooling architectures which do not require energy intensive refrigeration chillers. Also, the use of liquid immersion-cooling may, in certain cases, allow for greater compaction of electronic components at the electronic subsystem-level and/or electronic rack-level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water-based cooling approach. For at least these potential benefits, dielectric fluid immersion-cooling of one or more electronic systems (or portions of one or more electronic systems) of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a mineral oil, such as SpecTrosyn Oil, offered by Exxon-Mobil, may be employed if desired.

FIG. 1A is a schematic of one embodiment of a liquid-cooled electronics rack, generally denoted 100, employing immersion-cooling of electronic components and/or systems. As shown, liquid-cooled electronics rack 100 includes an electronics rack 101 containing a plurality of electronic systems 110 disposed, in the illustrated embodiment, horizontally so as to be stacked in drawers within the rack. By way of example, each electronic system 110 may be a server unit of a rack-mounted plurality of server units. In addition, each electronic system may include multiple electronic components to be cooled, which in one embodiment, may comprise multiple different types of electronic components having different heights and/or shapes within the electronic system.

The cooling apparatus is shown to include one or more modular cooling units (MCU) 120 disposed, by way of example, in a lower portion of electronics rack 101. Each modular cooling unit 120 may be similar to the modular cooling unit depicted in FIG. 2B, and described below. The modular cooling unit includes, for example, a liquid-to-liquid heat exchanger for extracting heat from coolant flowing through a system coolant loop 130 of the cooling apparatus and dissipating heat within a facility coolant loop 119, comprising a facility coolant supply line 121 and a facility coolant return line 122. As one example, facility coolant supply and return lines 121, 122 couple modular cooling unit 120 to a data center facility coolant supply and return (not shown). Modular cooling unit 120 further includes an appropriately sized reservoir, pump and optional filter for moving liquid-coolant under pressure through system coolant loop 130. In one embodiment, system coolant loop 130 includes a coolant supply manifold 131 and a coolant return manifold 132, which are coupled to modular cooling unit 120 via, for example, flexible hoses. The flexible hoses would allow the supply and return manifolds to be mounted within, for example, a door of the electronics rack hingedly mounted to the front or back of the electronics rack. In one example, coolant supply manifold 131 and coolant return manifold 132 each comprise an elongated rigid tube vertically mounted to the electronics rack 101 or to a door of the electronics rack.

In the embodiment illustrated, coolant supply manifold 131 and coolant return manifold 132 are in fluid communication with respective coolant inlets 135 and coolant outlets 136 of individual sealed housings or enclosures 140 containing the electronic systems 110. Fluid communication between the manifolds and the sealed enclosures is established, for example, via appropriately sized, flexible hoses 133, 134. In one embodiment, each coolant inlet 135 and coolant outlet 136 of a sealed enclosure is coupled to a respective liquid-cooled vapor condenser 150 disposed within the sealed enclosure 140. Heat removed from the electronic system 110 via the respective liquid-cooled vapor condenser 150 is transferred from the system coolant via the coolant return manifold 132 and modular cooling unit 120 to facility coolant loop 119. In one example, coolant passing through system coolant loop 130, and hence, coolant passing through the respective liquid-cooled vapor condensers 150 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 131, 132 each include ports which facilitate fluid connection of the respective coolant inlets and outlets 135, 136 of the enclosures (containing the electronic subsystems) to the manifolds via the flexible hoses 133, 134. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 148 may also be provided in each sealed enclosure 140, for example, at a back surface thereof, for docking into a corresponding electrical plane of the electronics rack in order to provide electrical and network connections 149 to the electronic system disposed within the sealed enclosure when the electronic system is operatively positioned within the sealed enclosure and the sealed enclosure is operatively positioned within the electronics rack.

Figure 1B:
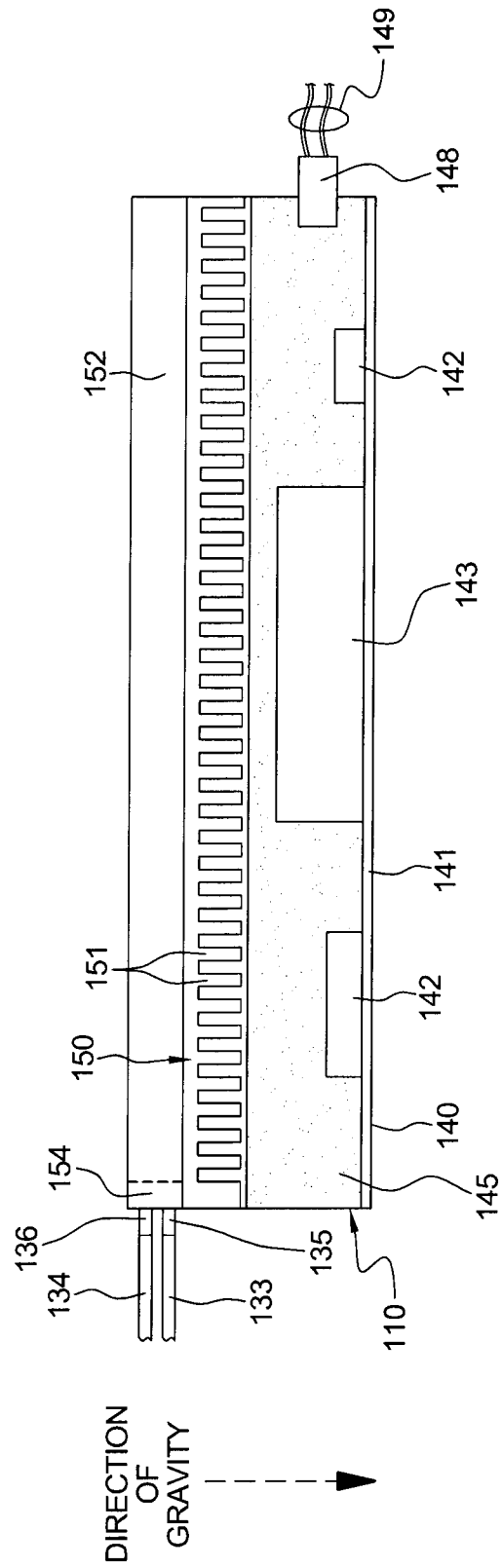
FIG. 1B is a cross-sectional elevational view of one immersion-cooled electronic system of the liquid-cooled electronics rack of FIG. 1A, in accordance with one or more aspects of the present invention.

As illustrated in FIG. 1B, in one or more implementations, electronic system 110 may comprise a plurality of electronic components 142, 143 of different height and/or type on a substrate 141, and is shown within sealed enclosure 140 with the plurality of electronic components 142, 143 immersed within a dielectric fluid 145. Sealed housing 140 is configured to at least partially surround and form a sealed compartment about the electronic system with the plurality of electronic components 142, 143 disposed within the sealed compartment. In an operational state, dielectric fluid 145 pools in the liquid state at the bottom of the sealed compartment and is of sufficient volume to submerge the electronic components 142, 143. The electronic components 142, 143 dissipate varying amounts of power, which cause the dielectric fluid to boil, releasing dielectric fluid vapor, which rises to the upper portion of the sealed compartment of the housing.

The upper portion of sealed enclosure 140 is shown in FIG. 1B to include liquid-cooled vapor condenser 150. Liquid-cooled vapor condenser 150 is a thermally conductive structure which (in one or more embodiments) includes a liquid-cooled base plate 152, and a plurality of thermally conductive condenser fins 151 extending therefrom in the upper portion of the sealed compartment. A plenum structure 154 comprises part of liquid-cooled base plate 152, and facilitates passage of system coolant through one or more channels in the liquid-cooled base plate 152. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 150, the condensed liquid may be close in temperature to the vapor temperature or could be sub-cooled to a much lower temperature.

Advantageously, in immersion-cooling such as depicted in FIGS. 1A & 1B, all of the components to be cooled are immersed in the dielectric fluid. The system fluid can tolerate a larger temperature rise, while maintaining component temperatures, thus allowing a smaller flow rate, and higher inlet temperatures, improving energy efficiency of the resultant cooling apparatus.

Immersion-cooling of an electronic system, such as a server, may present problems with regards to servicing or replacing in the field one or more of the components of the electronic system, such as one or more memory modules. Servicing/replacing a component with an immersion-cooled electronic system approach, requires that the electronic system be drained, and that the sealed enclosure be opened to access the electronic component(s) to be serviced or replaced. One embodiment of this is depicted in FIG. 2A.

Figure 2A:
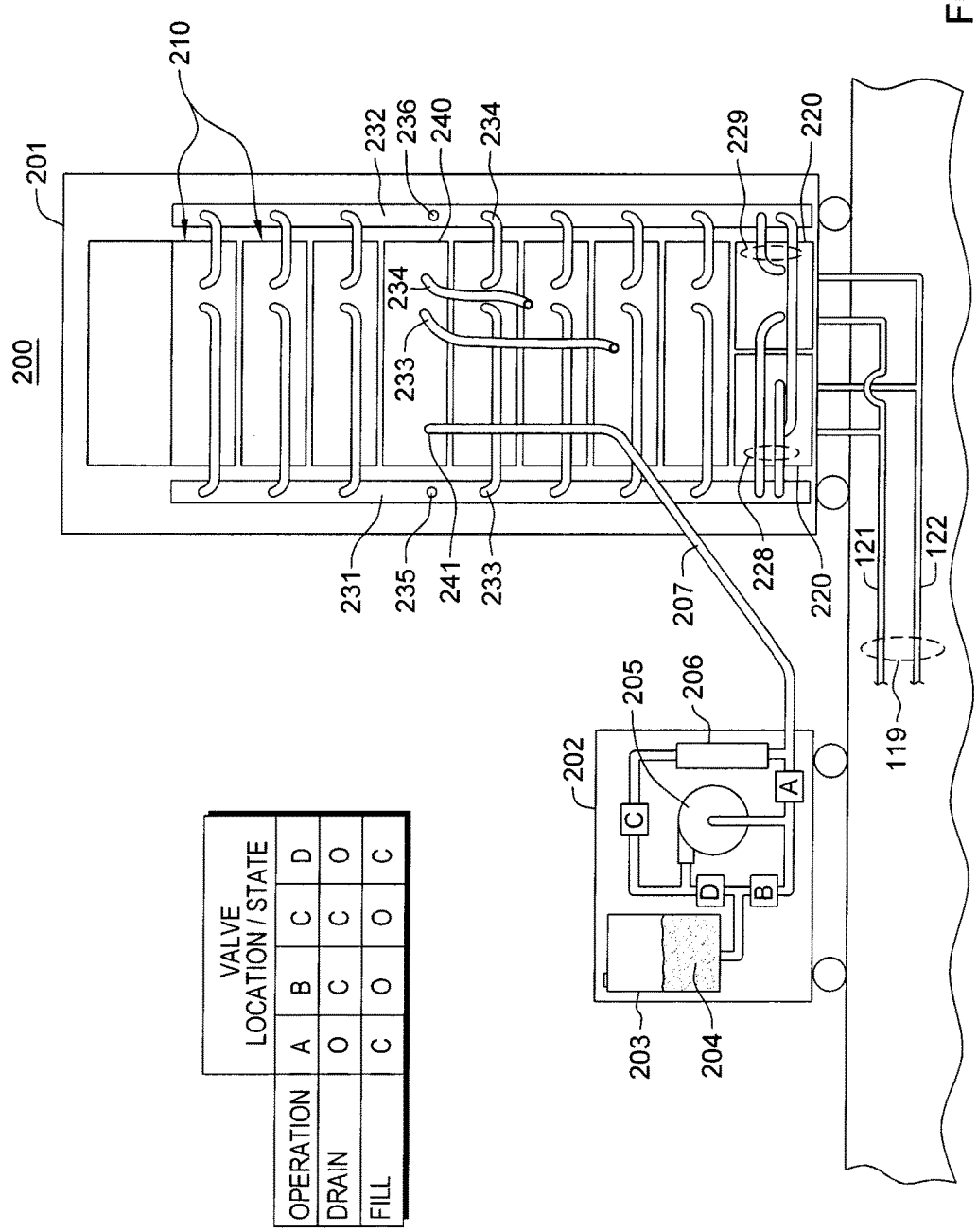
FIG. 2A is a schematic depiction of another embodiment of a liquid-cooled electronics rack with drawer-level immersion-cooling of electronic components and/or systems thereof, and showing one drawer-level enclosure coupled to a fill and drain tool for servicing, in accordance with one or more aspects of the present invention.

Referring to FIG. 2A, another embodiment of a liquid-cooled electronics rack, generally denoted 200, employing immersion-cooling of electronic components or systems, is depicted, in accordance with one or more aspects of the present invention. Cooled electronics rack 200 includes an electronics rack 201 containing a plurality of electronic systems 210 disposed, in the illustrated embodiment, horizontally and stacked in drawers within the rack. By way of example, each electronic system 210 may be a server unit of a rack-mounted plurality of server units. In addition, each electronic system may include one or more electronic components to be cooled, which in one embodiment, may comprise multiple different types of electronic components having different heights and/or shapes within the electronic system.

Figure 2B:
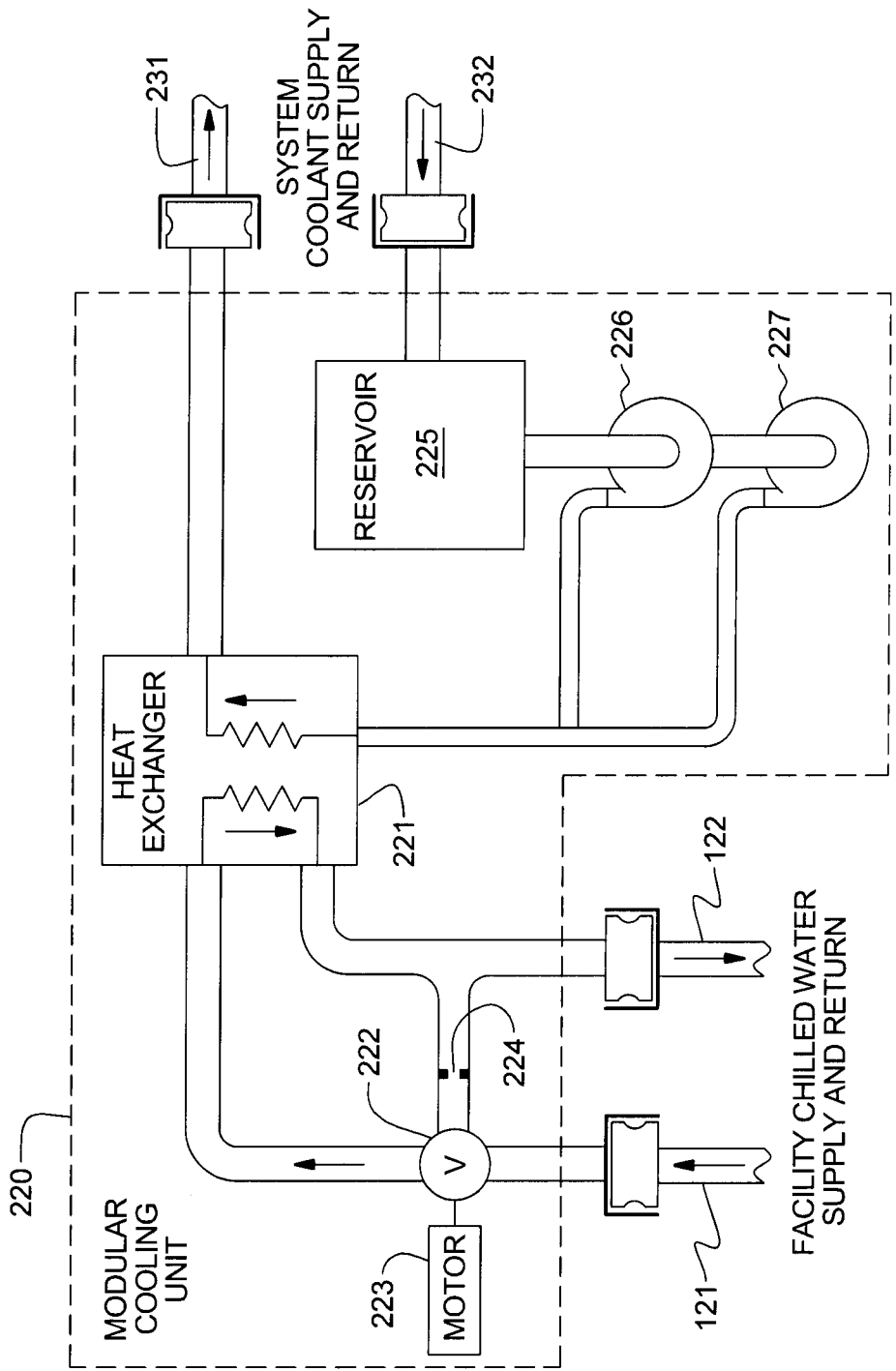
FIG. 2B is a schematic of one embodiment of a modular cooling unit for a liquid-cooled electronics rack such as depicted in FIG. 2A, in accordance with one or more aspects of the present invention.

The cooling apparatus is similar in certain respects to that depicted in FIGS. 1A & 1B. For instance, the cooling apparatus includes one or more modular cooling units (MCUs) 220 disposed, by way of example, in a lower portion of electronics rack 201. FIG. 2B illustrates one embodiment of a modular cooling unit 220.

Referring to FIG. 2B, modular cooling unit 220 includes, in one or more embodiments, couplings to facility coolant loop 119, comprising facility coolant supply line 121 and facility coolant return line 122. As illustrated, facility coolant is supplied through a control valve 222 driven by a motor 223. Control valve 222 determines an amount of facility coolant to be passed through a liquid-to-liquid heat exchanger 221, with a portion of the facility coolant possibly being returned directly via a bypass orifice 224. The modular cooling unit further includes a system coolant loop having a reservoir tank 225 from which system coolant is pumped, either by pump 226 or pump 227, into liquid-to-liquid heat exchanger 221 for conditioning and output thereof, as cooled system coolant, to the liquid-cooled heat sinks within the electronics rack being cooled. As illustrated, the cooled system coolant may be supplied to the system coolant supply manifold 231, and returned from the system coolant return manifold 232.

As illustrated in FIG. 2A, in one or more examples, flexible manifold-level supply and return hoses 228, 229 couple in fluid communication the respective modular cooling units 220 to coolant supply manifold 231 and coolant return manifold 232. By way of example, coolant supply manifold 231 and coolant return manifold 232 may each comprise an elongated rigid tube vertically mounted to electronic rack 201, or to a door of the electronics rack.

In the embodiment of FIG. 2A, coolant supply manifold 231 and coolant return manifold 232 are coupled to respective liquid supply and return connectors associated with the individual enclosures 240 containing the electronic systems 210. By way of example, enclosures 240 may be drawer-level enclosures sized to reside within electronics rack 201 and configured to be removable from the electronics rack for, for instance, servicing of the electronic components or systems within the enclosure. Further, enclosures 240 are, in one or more embodiments, sealed enclosures, which may include an enclosure cover sealed in a fluid type manner to enclosure 240 to form a fluid-tight compartment within the enclosure. Fluid communication between coolant supply and return manifolds 231, 232 and enclosures 240 containing the electronic systems 210 can be established, for instance, via appropriately sized flexible hoses 233, 234.

In one or more embodiments, each liquid supply and return connector of an enclosure 240 is coupled to an inlet or outlet of a respective hinged, liquid-cooled heat sink 250 (FIG. 2C) disposed within the enclosure 240. Heat removed from electronic system 210 via the respective hinged, liquid-cooled heat sink 250 is transferred from the system coolant via the coolant return manifold 232 and modular cooling unit 220 to facility coolant loop (FIG. 2B). In one example, coolant passing through the system coolant loop, and hence, coolant passing through the respective hinged, liquid-cooled heat sink 250 comprises water.

As with the embodiment of FIGS. 1A & 1B, fluid coupling between the electronic systems or subsystems and coolant manifolds, as well as between the manifolds and the modular cooling unit(s) can be established using suitable hoses, host barb fittings, and quick connect couplers. In one example, the vertically-oriented coolant supply and return manifolds 231, 232 each include ports 235, 236 which facilitate fluid connection of the respective liquid supply and return connectors of the enclosures 240 to the manifolds via the flexible hoses 233, 234. Respective quick connect couplings may be employed to couple the flexible hoses to the liquid supply and return connectors of the enclosures and/or the manifolds to allow for, for example, removable of an enclosure and electronic system from the electronics rack. The quick connect couplings may be any of the various types of commercially available couplings, such as those available from Colder Products Co., of St. Paul Minn., USA, or Parker Hannifin, of Cleveland, Ohio, USA.

As in the embodiment described above in connection with FIGS. 1A & 1B, one or more hermetically sealed electrical connectors may be provided in association with each enclosure 240, for example, at a back surface thereof, for docking into a respective electrical plane of the electronics rack in order to provide electrical and network connections to the electronic system or components disposed within the enclosure 240 when the electronic system is operatively position within the enclosure and the enclosure is operatively positioned within the electronics rack.

As explained further below in connection with FIGS. 3A-3C, a dielectric fluid, comprising (in one or more embodiments) a liquid dielectric, is disposed within each enclosure for drawer-level immersion cooling of the one or more electronic components or system within the enclosure. The use of direct immersion cooling with dielectric coolant offers a means for providing enhanced cooling to the components and/or system. Advantageously, as described herein, field serviceability is also maintained, notwithstanding the use of drawer-level immersion cooling of electronic components, or system. One embodiment of the cooling apparatus illustrating field serviceability is depicted in FIGS. 2A & 2C.

Referring first to FIG. 2A, flexible hoses 233, 234 of a selected enclosure 240 are shown disconnected from the respective manifolds 231, 232. Additionally, a fill/drain line 207 has been coupled to a fill/drain port 241 of the enclosure 240 to couple in fluid communication a fill/drain cart 202 with the compartment containing the dielectric fluid within enclosure 240.

As illustrated, in on or more implementations, fill/drain cart 202 includes a dielectric coolant storage tank 203 filled, at least partially, with a liquid dielectric 204. Additionally, a pump 205 and a filter 206 are housed within fill/drain cart 202, as well as tubing with solenoid valves A, B, C & D. In the legend in FIG. 2A, the open 'O' and closed 'C' states for the solenoid valves are provided for both a drain operation, and a fill operation, where the drain operation drains liquid dielectric from the compartment of the enclosure, and the fill operation pumps liquid dielectric into the compartment of the enclosure.

Figure 2C:
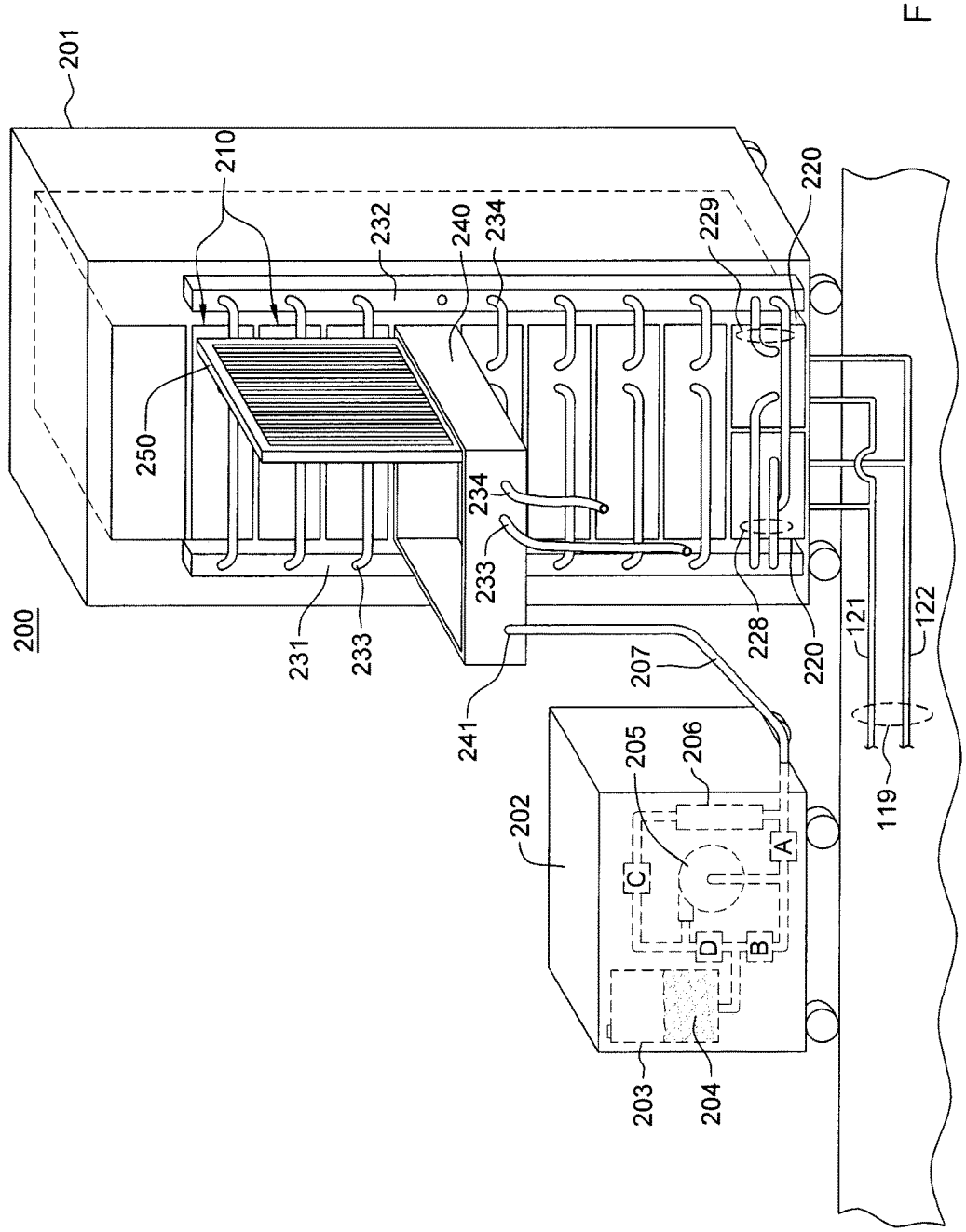
FIG. 2C depicts the liquid-cooled electronics rack of FIG. 2A, with one drawer-level enclosure shown removed from the electronics rack, and the associated liquid-cooled heat sink shown rotated to a service position to allow access to one or more electronic components within the drawer-level enclosure, in accordance with one or more aspects of the present invention.

In FIG. 2C, the enclosure 240 containing the electronic system to be serviced is shown removed, at least in part, from electronics rack 201. Once enclosure 240 has been pulled out, the enclosure cover (not shown) may be removed and the liquid dielectric may be drained into fill/drain cart 202. To drain enclosure 240, solenoid valves A & D are opened, as shown in the table in FIG. 2A, while valves B & C remain closed. Although liquid dielectric will drain by gravity from enclosure 240, pump 205 of fill/drain cart 202 may be activated to expedite the process.

Once drained, servicing of one or more of the electronic components or electronic system within the enclosure is facilitated by rotating hinged, liquid-cooled heat sink 250 from an operational position overlying the one or more electronic components or system within the compartment, to a service position (as illustrated in FIG. 2C), which allows for access to the one or more electronic components or system within the compartment. Embodiments of the hinged, liquid-cooled heat sink and mounting of the heat sink within the enclosure are described further below with reference to FIGS. 3A-4.

After servicing the electronic components or system, solenoid valves A & D of fill/drain cart 202 may be closed and valves B & C opened. The pump 205 may then be activated to pump liquid dielectric from dielectric coolant storage tank 203 through particulate filter 206 and fill/drain line 207 to the enclosure 240. Filter 206 may be provided to ensure that clean liquid dielectric is delivered back into the enclosure. Once the liquid dielectric reaches a desired level within the compartment of enclosure 240, the pump may be turned off, and the fill/drain line 207 may be disconnected. In one or more implementations, fill/drain port 241 may comprise a quick disconnect coupling which facilitates connection and disconnection of fill/drain line 207 to/from enclosure 240. Once fill/drain line 207 is disconnected, the hinged, liquid-cooled heat sink 250 may be rotated back into position; that is, returned to an operational position overlying the one or more electronic components or system within the compartment of the enclosure. The enclosure cover (not shown) may then be refastened to the enclosure, and the enclosure returned to an operational position within electronics rack 201. System coolant flow can be re-established into the enclosure 240 by recoupling flexible hoses 233, 234 to the respective coolant supply and return manifolds 231, 232. Power may then be restored to the one or more electronic components/systems within the compartment of the enclosure that was serviced. Note that this servicing may occur concurrent with continued operation of the other components/systems within the electronics rack. In particular, power and coolant flow to only the selected node-level enclosure being serviced is interrupted during the field servicing.

Figure 3A:
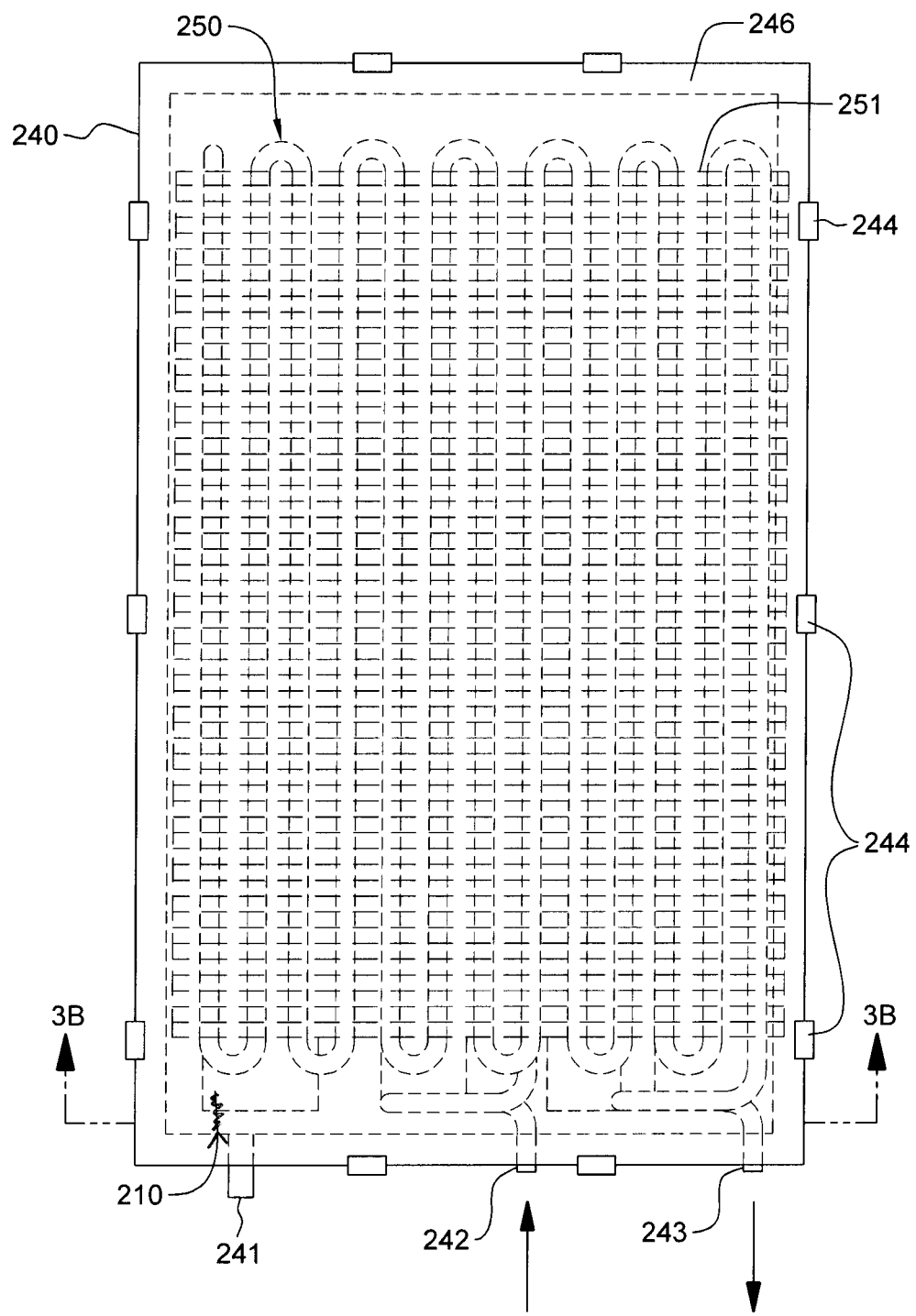
FIG. 3A is a plan view of one embodiment of a drawer-level, immersion-cooled electronic system of a liquid-cooled electronics rack such as depicted in FIGS. 2A-2C, with the hinged, liquid-cooled heat sink shown in operational position, in accordance with one or more aspects of the present invention.
Figure 3B:
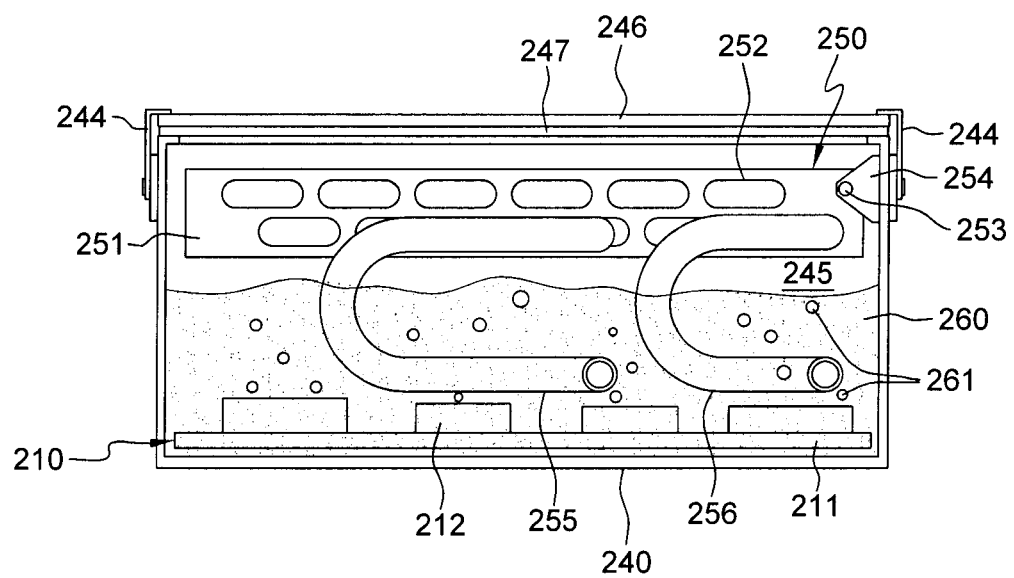
FIG. 3B is a cross-sectional elevational view of the drawer-level, immersion-cooled electronic system of FIG. 3A, taken along line 3B-3B thereof, in accordance with one or more aspects of the present invention.
Figure 3C:
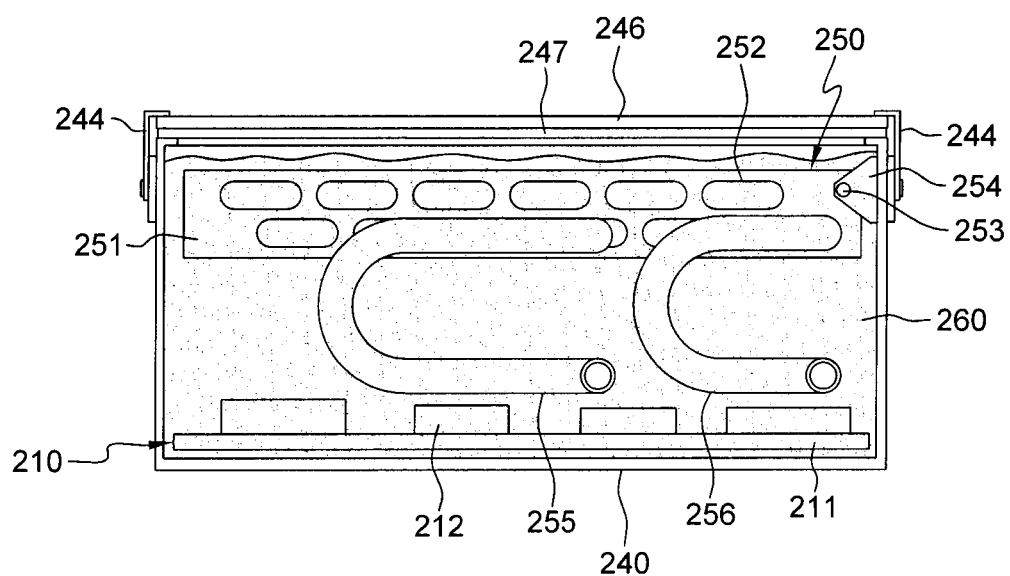
FIG. 3C is a cross-sectional elevational view of another embodiment of a drawer-level, immersion-cooled electronic system, wherein single-phase, natural convection immersion-cooling replaces the two-phase immersion-cooling of FIGS. 3A-3B, in accordance with one or more aspects of the present invention.

FIGS. 3A-3C depict in greater detail one embodiment of a cooling apparatus comprising a drawer-level enclosure 240. Referring first to FIGS. 3A & 3B, the electronic system 210, and in particular, the drawer-level, immersion-cooled electronic system comprises, in one or more implementations, a circuit board 211 supporting one or more electronic components or modules 212. As illustrated in FIG. 3B, electronic system 210 resides within a compartment 245 defined by enclosure 240 and cover 246. In a depicted implementation, multiple cover latches 244 are provided about the periphery of enclosure 240, as well as a seal 247, which together secure cover 246 in a fluid-tight manner to enclosure 240 and facilitate defining a fluid-tight compartment 245. Within compartment 245 dielectric fluid is provided which includes, for instance, both liquid dielectric 260 and vapor dielectric 261 (FIG. 3B) generated by pool boiling of the liquid dielectric 260. In the embodiment illustrated, electronic system 210 is fully immersed within liquid dielectric 260, by way of example only.

In the implementation of FIGS. 3A & 3B, the upper region of compartment 245 includes hinged, liquid-cooled heat sink 250. Note that this position is provided by way of example only. Hinged, liquid-cooled heat sink may be implemented in a variety of configurations. For instance, as illustrated in FIG. 3A, the heat sink may substantially cover or overlie the entire electronic system 210 disposed in a lower region of compartment 245, or alternatively, could cover only a portion of the electronic system, as required for a particular application. Hinged, liquid-cooled heat sink 250 is a thermally conductive structure which (in one or more embodiments) includes one or more thermally conductive, coolant-carrying tubes 252, and the plurality of thermally conductive fins 251 coupled to thermally conductive tube 252. In the two-phase implementation of FIGS. 3A & 3B, the plurality of thermally conductive fins 251 are a plurality of thermally conductive condenser fins. In operation, dielectric fluid vapor 261 rises and contacts the cool surfaces of the thermally conductive condenser fins, where the vapor condenses back to liquid phase, and drops downward towards the lower region of the sealed compartment 245.

FIG. 3C depicts an alternate embodiment, wherein single phase, natural convection cooling occurs. In this embodiment, the liquid dielectric 260 substantially fills compartment 245, so that hinged, liquid-cooled heat sink 250 is immersed within liquid dielectric 260. Depending upon the heat flux level from the electronic components or system 210, the individual heat dissipating components within the compartment may be cooled by either the pool boiling approach of FIG. 3B, or the natural convection approach of FIG. 3C.

Note also, that the particular liquid-cooled heat sink 250 configuration illustrated is presented by way of example only, not by way of limitation. For instance, other heat sink configurations could be employed to facilitate condensing of dielectric fluid vapor and/or direct cooling of liquid dielectric. For example, the hinged, liquid-cooled heat sink 250 could comprise a liquid-cooled base plate (not shown) with a plurality of thermally conductive condenser fins extending from the base plate in the upper region of the sealed compartment. The liquid-cooled base plate could comprise any desired coolant-carrying channel configuration that facilitates passage of system coolant through the liquid-cooled heat sink.

As illustrated in the embodiment of FIG. 3A, enclosure 240 may include a liquid supply connector 242 and a liquid return connector 243 associated with enclosure 240, and in particular, with a sidewall of the enclosure. Additionally, a flexible liquid supply hose 255 and a flexible liquid return hose 256 are provided within compartment 245 to couple in fluid communication the liquid supply and return connectors 242, 243, respectively, to the hinged, liquid-cooled heat sink 250. In one or more implementations, appropriate hose barb fittings and clamps may be used to couple the flexible liquid supply and return hoses 255, 256 between the connectors and heat sink. Further, in one or more embodiments, fill/drain port 241, as well as liquid supply and return connectors 242, 243 are disposed in a lower region of the compartment 245 along, for instance, a front side wall of enclosure 240 accessible, for instance, at the front of the electronics rack to which the enclosure is to be operatively docked.

In operation, system coolant supplied to liquid supply connector 242 of enclosure 240 passes through flexible liquid supply hose 255 to hinged, liquid-cooled heat sink 250 and cools the solid material of the heat sink such that, in the example of FIG. 3B, the thermally conductive condenser fins that are exposed within the compartment to the dielectric fluid vapor (or to the liquid dielectric in the example of FIG. 3C) are well below saturation temperature of the vapor. Thus, vapor in contact with the cooler condenser fin surfaces will reject heat to the surfaces and condense back to liquid form. Based on operating conditions of the hinged, liquid-cooled heat sink 250, the condensed liquid may be close in temperature to the vapor temperature, or could be sub-cooled to a much lower temperature.

Figure 4:
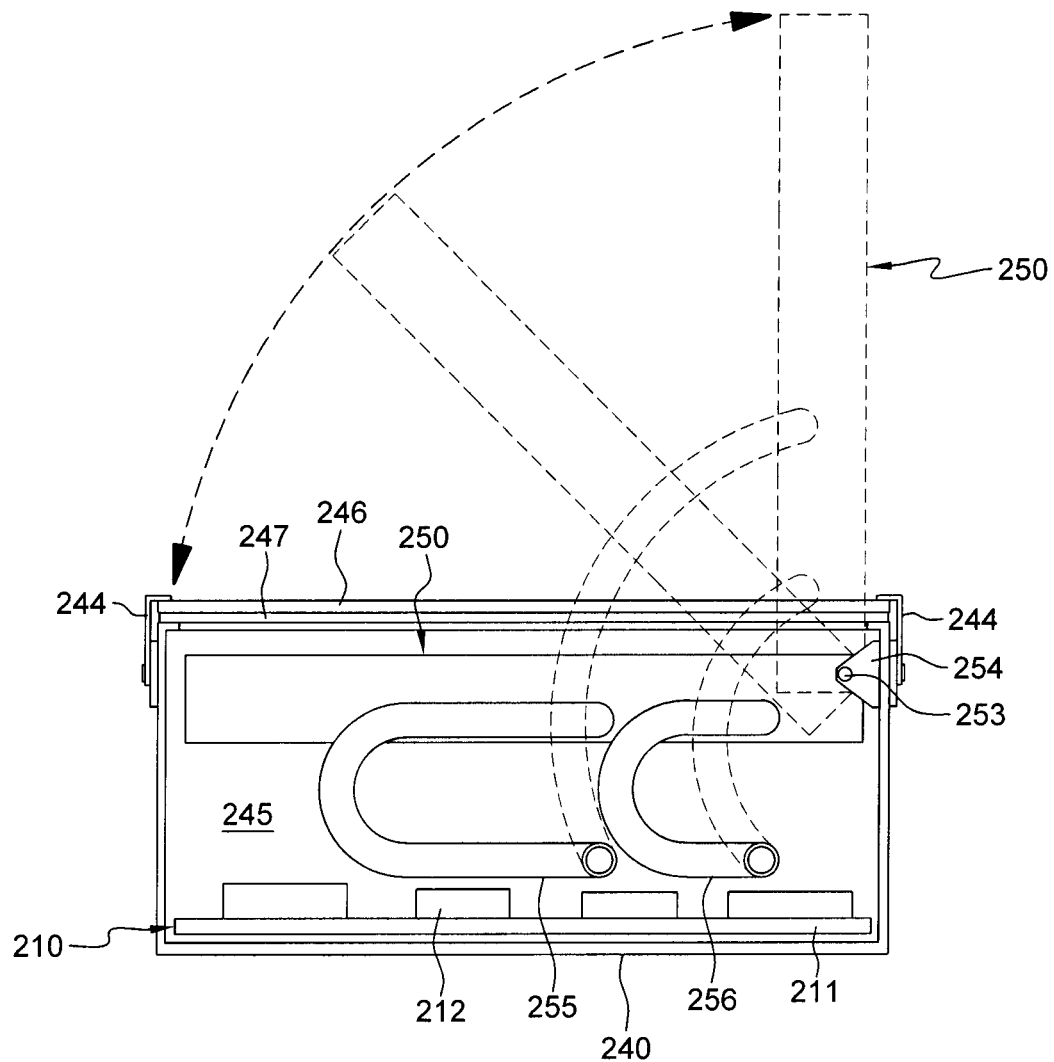
FIG. 4 is an elevational view of the drawer-level, cooled electronics system of FIGS. 3A-3C, illustrating rotation of the hinged, liquid-cooled heat sink between an operational position overlying the one or more electronic components being immersion-cooled, and a service position which allows for access to the one or more electronic components, in accordance with one or more aspects of the present invention.

In one or more enclosures 240, a liquid-cooled heat exchanger 250 may be hingedly mounted to the enclosure via one or more appropriate hinges 253 and brackets 254. For instance, liquid-cooled heat sink 250 may be hingedly mounted to a sidewall of an enclosure 240 in an upper region of compartment 245, as illustrated in FIGS. 3B-4. In one or more implementations, the hinged, liquid-cooled heat sink 250 is oriented horizontally within compartment 245 in the upper region of the compartment when in operational position, overlying, for instance, the one or more electronic components or system being immersion-cooled.

As illustrated in FIG. 4, hinged, liquid-cooled heat sink 250 is rotatable from the operational position to a service position, where the heat sink extends substantially vertically from enclosure 240. Note that in FIG. 4, the drawer-level enclosure 240 and electronic system 210 sub-assembly is shown without liquid dielectric within compartment 245. In the service position, an operator is allowed access to the one or more electronic components or system within compartment 245 to, for instance, replace or repair the component/system. Note also that, in one or more implementations, the flexible liquid supply and return hoses 255, 256 remain connected and are of sufficient length and flexibility to allow for rotation of the heat sink between the operational position and service position without disconnection. Further, note that, in the example depicted, flexible liquid supply hose 255 has a longer length than flexible liquid return hose 256, by way of example only. In one or more implementations, the liquid supply and return connectors 242, 243 (FIG. 3A) are located near the hinge 253 to allow for minimizing the length of flexible liquid supply and return hoses 255, 256.

Note from the above discussion that a cooling apparatus and cooled electronic system are provided herein which allow for field replicability of one or more immersion-cooled electronic components or systems within, for instance, a drawer of a multi-drawer electronics rack to allow for servicing of the component/system, while the remainder of the electronics rack is powered and functioning, and continuing to be cooled.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
an enclosure sized to reside within an electronics rack, the enclosure comprising a compartment accommodating one or more electronic components;
a dielectric fluid within the compartment, the dielectric fluid comprising a liquid dielectric at least partially immersing the one or more electronic components; and
a hinged, liquid-cooled heat sink disposed within the compartment of the enclosure and operatively facilitating cooling the one or more electronic components via the dielectric fluid within the compartment, the hinged, liquid-cooled heat sink being rotatable between an operational position overlying the one or more electronic components within the compartment, and a service position which allows access to the one or more electronic components within the compartment.

2. The cooling apparatus of claim 1, further comprising a liquid supply connector and a liquid return connector associated with the enclosure, and a flexible liquid supply hose and a flexible liquid return hose disposed within the compartment of the enclosure, the flexible liquid supply and return hoses respectively coupling in fluid communication the liquid supply connector and the liquid return connector to the hinged, liquid-cooled heat sink.

3. The cooling apparatus of claim 2, wherein the flexible liquid supply hose and flexible liquid return hose each have a respective length which allows for rotating of the hinged, liquid-cooled heat sink between the operational position and the service position while remaining connected to the respective liquid supply and return connectors.

4. The cooling apparatus of claim 3, wherein one of the flexible liquid supply hose or the flexible liquid return hose is longer than the other.

5. The cooling apparatus of claim 3, wherein the hinged, liquid-cooled heat sink is horizontally-oriented and disposed in an upper region of the compartment when in the operational position, and is vertically-oriented and extending away from the compartment when in the service position.

6. The cooling apparatus of claim 5, wherein the liquid supply connector and liquid return connector are disposed at a side wall of the enclosure.

7. The cooling apparatus of claim 1, wherein the enclosure comprises a cover, the cover being removable to allow for transitioning of the hinged, liquid-cooled heat sink from the operational position to the service position.

8. The cooling apparatus of claim 1, wherein the hinged, liquid-cooled heat sink comprises at least one vapor-condensing surface, and the dielectric fluid provides two-phase cooling of the one or more electronic components within the compartment, the hinged, liquid-cooled heat sink with the at least one vapor-condensing surface residing in an upper region of the compartment of the enclosure, the upper region of the compartment comprising a vapor region of the dielectric fluid.

9. The cooling apparatus of claim 1, wherein the hinged, liquid-cooled heat sink is immersed within liquid dielectric within the compartment, the liquid dielectric providing single-phase, natural convection, immersion-cooling of the one or more electronic components within the compartment.

10. The cooling apparatus of claim 9, wherein the liquid dielectric fills a majority of the compartment, and the hinged, liquid-cooled heat sink resides in an upper region of the compartment of the enclosure.

11. A cooled electronics rack comprising:
an electronics rack comprising a plurality of electronic systems; and
a cooling apparatus comprising:
  a plurality of drawer-level enclosures sized to reside within the electronics rack, each drawer-level enclosure comprising a compartment accommodating a respective electronic system of the plurality of electronic systems;
  a dielectric fluid within each compartment, the dielectric fluid comprising a liquid dielectric at least partially immersing the respective electronic system within the compartment; and
  at least one hinged, liquid-cooled heat sink associated with at least one drawer-level enclosure of the plurality of drawer-level enclosures, each hinged, liquid-cooled heat sink being disposed within the compartment of a respective drawer-level enclosure of the at least one drawer-level enclosure and operatively facilitating cooling the respective electronic system via the dielectric fluid within the compartment, each hinged, liquid-cooled heat sink being rotatable between an operational position overlying the respective electronic system within the compartment, and a service position which allows access to the electronic system within the compartment.

12. The cooled electronics rack of claim 11, wherein the cooling apparatus comprises a plurality of hinged, liquid-cooled heat sinks, the at least one hinged, liquid-cooled heat sink being at least one hinged, liquid-cooled heat sink of the plurality of hinged, liquid-cooled heat sinks, and each hinged, liquid-cooled heat sink being associated with a respective drawer-level enclosure of the plurality of drawer-level enclosures, and being rotatable between the operational position overlying the respective electronic system within the compartment, and the service position which allows access to the respective electronic system within the compartment.

13. The cooled electronics rack of claim 12, further comprising respective liquid supply and return connectors associated with each drawer-level enclosure, and wherein the cooling apparatus further comprises flexible liquid supply hoses and flexible liquid return hoses disposed within the compartments of the plurality of drawer-level enclosures, wherein within the compartment of each drawer-level enclosure, a respective flexible liquid supply hose and respective flexible liquid return hose couple in fluid communication the associated hinged, liquid-cooled heat sink to the respective liquid supply and return connectors associated with that drawer-level enclosure.

14. The cooled electronics rack of claim 13, wherein the flexible liquid supply hose and flexible liquid return hose within the compartment of each drawer-level enclosure of the plurality of drawer-level enclosures has a respective length which allows for rotating of the associated hinged, liquid-cooled heat sink between the operational position and the service position while remaining connected to the respective liquid supply and return connectors.

15. The cooled electronics rack of claim 14, wherein each hinged, liquid-cooled heat sink is horizontally oriented and disposed in a upper region of the associated compartment when in the operational position, and is vertically oriented and extending away from the compartment when in the service position.

16. The cooled electronics rack of claim 11, wherein the at least one hinged, liquid-cooled heat sink comprises at least one vapor-condensing surface, and the dielectric fluid provides two phase cooling of the respective electronic system within the compartment of the respective drawer-level enclosure, each at least one hinged, liquid-cooled heat sink with the at least one vapor-condensing surface residing in an upper region of the compartment of the respective drawer-level enclosure of the at least one drawer-level enclosure, the upper region of the compartment comprising a vapor region of the dielectric fluid.

17. The cooled electronics rack of claim 11, wherein each at least one hinged, liquid-cooled heat sink is immersed within liquid dielectric within the compartment of the respective drawer-level enclosure of the at least one drawer-level enclosure, the liquid dielectric providing single phase, natural convection, immersing cooling of the respective electronic system within the compartment.

18. The cooled electronics rack of claim 17, wherein the liquid dielectric fills a majority of the compartment, and each at least one hinged, liquid-cooled heat sink resides in an upper region of the respective compartment.

* * * * *